(12) United States Patent
Kanazawa

(10) Patent No.: US 10,969,454 B2
(45) Date of Patent: Apr. 6, 2021

(54) MAGNETIC RESONANCE IMAGING APPARATUS AND MAGNETIC RESONANCE IMAGING METHOD

(71) Applicant: Canon Medical Systems Corporation, Otawara (JP)

(72) Inventor: Hitoshi Kanazawa, Utsunomiya (JP)

(73) Assignee: Canon Medical Systems Corporation, Otawara (JP)

( * ) Notice: Subject to any disclaimer, the term of this patent is extended or adjusted under 35 U.S.C. 154(b) by 69 days.

(21) Appl. No.: 16/533,142

(22) Filed: Aug. 6, 2019

(65) Prior Publication Data

US 2020/0049781 A1 Feb. 13, 2020

(30) Foreign Application Priority Data

Aug. 7, 2018 (JP) .............................. JP2018-148766

(51) Int. Cl.
*G01R 33/54* (2006.01)
*G01R 33/48* (2006.01)
*G01R 33/483* (2006.01)

(52) U.S. Cl.
CPC ....... *G01R 33/543* (2013.01); *G01R 33/4824* (2013.01); *G01R 33/4836* (2013.01)

(58) Field of Classification Search
CPC .............. G01R 33/543; G01R 33/4824; G01R 33/4836; G01R 33/4833; G01R 33/5617; G01R 33/56563
See application file for complete search history.

(56) References Cited

U.S. PATENT DOCUMENTS

| 4,733,186 A * | 3/1988 | Oppelt ................... G01R 33/50 324/307 |
| 5,508,612 A | 4/1996 | Kanazawa et al. |
| 2018/0210051 A1* | 7/2018 | Carinci ............. G01R 33/5617 |

FOREIGN PATENT DOCUMENTS

JP  3483947 B2  1/2004

OTHER PUBLICATIONS

P. A. Bottomley, et al., "Two-Dimensional spatially selective spin inversion and spin-echo refocusing with a single nuclear magnetic resonance pulse", Journal of Applied Physics, vol. 62, Issue.IO, pp. 4284-4290, Nov. 1987.

(Continued)

*Primary Examiner* — Susan S Lee
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry sets an excitation pulse sequence that applies an excitation pulse including an inversion pulse between at least one set of sub pulses of a local excitation radio frequency pulse formed of a plurality of sub pulses, and applies a spoiler gradient magnetic field that disperses transverse magnetization while applying the inversion pulse. The processing circuitry controls execution of the excitation pulse sequence by applying the excitation pulse and the spoiler gradient magnetic field according to the excitation pulse sequence, and collects a magnetic resonance signal based on a data collecting sequence after execution of the excitation pulse sequence.

16 Claims, 20 Drawing Sheets

(56) References Cited

OTHER PUBLICATIONS

J. Yuan, et al., "Reduced Field-of View Single-Shot Fast Spin Echo Imaging Using Two-Dimensional Spatially Selective Radiofrequency Pulses", Journal of Magnetic Resonance Imaging, vol. 32, pp. 242-248, 2010.
D. S. Williams, et al., "A Chemical-Shift Insensitive Slice-Selective RF Pulse (CHISS)", Journal of Magnetic Resonance, vol. 91, pp. 57-64, 1991.
D. A. Feinberg, et al., "Gradient• Echo Shifting on Fast MRI Techniques (GRASE Imaging) for Correction of Field Inhomogeneity Errors and Chemical Shift", Journal of Magnetic Resonance, vol. 97, pp. 177-183, 1992.
M. G. Busch, et al., "Spatially 2D-Selective RF Excitations Using the PROPELLER Trajectory: Basic Principles and Application to MR Spectroscopy of Irregularly Shaped Single Voxel", Magnetic Resonance in Medicine, vol. 66, pp. 1218-1225, 2011.

\* cited by examiner

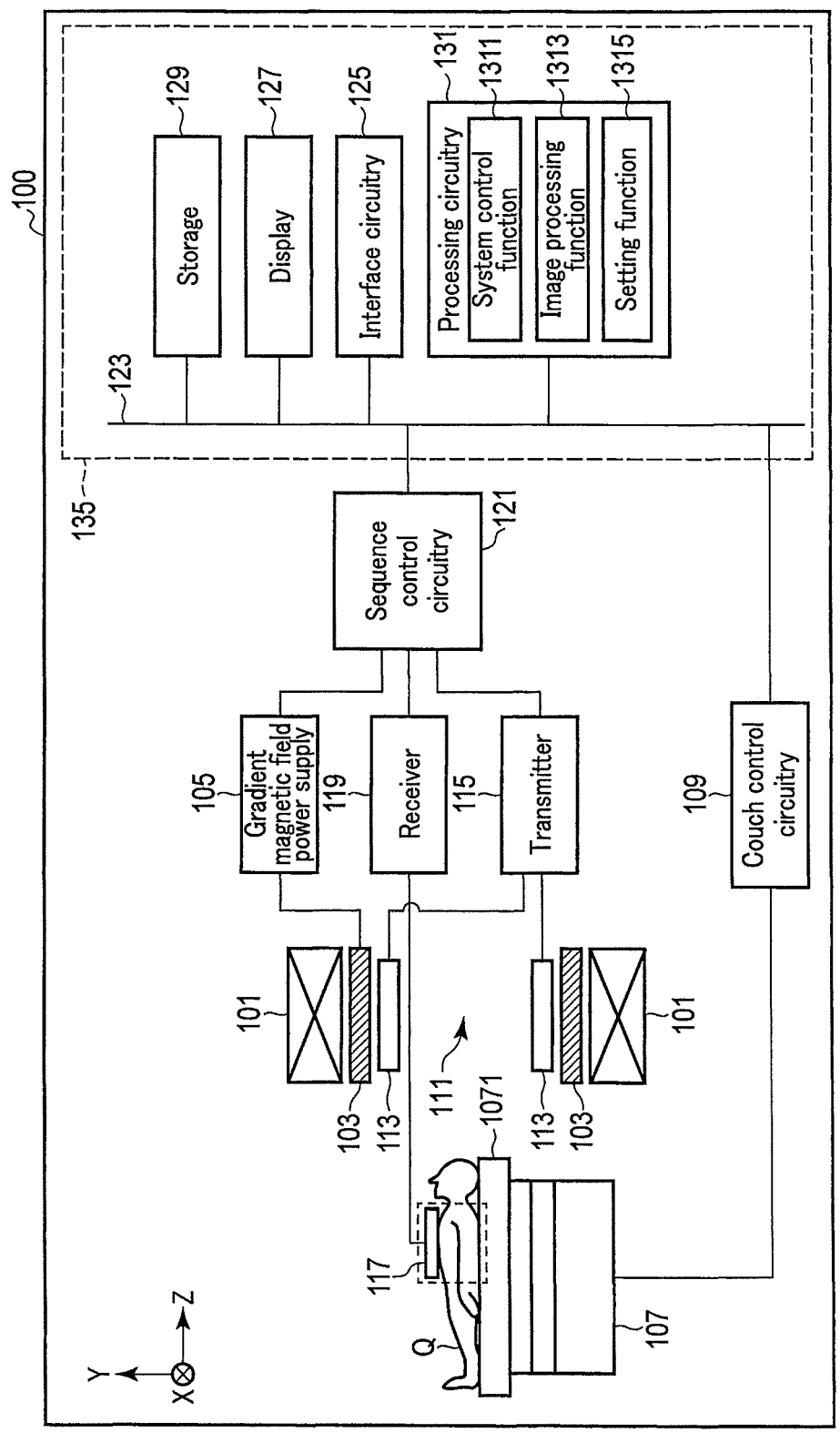
F I G. 1

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from the prior Japanese Patent Application No. 2018-148766, filed Aug. 7, 2018, the entire contents of which are incorporated herein by reference.

FIELD

Embodiments described herein relate generally to a magnetic resonance imaging apparatus and a magnetic resonance imaging method.

BACKGROUND

There is a two-dimensional local excitation method that selects and excites not only a slice surface but also one direction within the surface in an imaging area. In the two-dimensional local excitation method, an excitation pulse for slice selection is divided into a plurality of sub pulses and applied, a phase change is generated on an imaging surface in an excitation period of the sub pulses, and a space selective excitation characteristic is obtained also in a direction where the phase change is generated.

However, in the two-dimensional local excitation method, when inhomogeneity of a static magnetic field is present, there is a problem that an excitation position is shifted in a gradient direction of a gradient magnetic field by the phase change among the sub pulses. In particular, when excitation time becomes long in a case where the number of the sub pulses is large or the like, the phase change will adversely effect.

BRIEF DESCRIPTION OF THE DRAWINGS

FIG. 1 is a diagram showing a configuration of a magnetic resonance imaging apparatus relating to a first embodiment;

DETAILED DESCRIPTION

Figure 2:
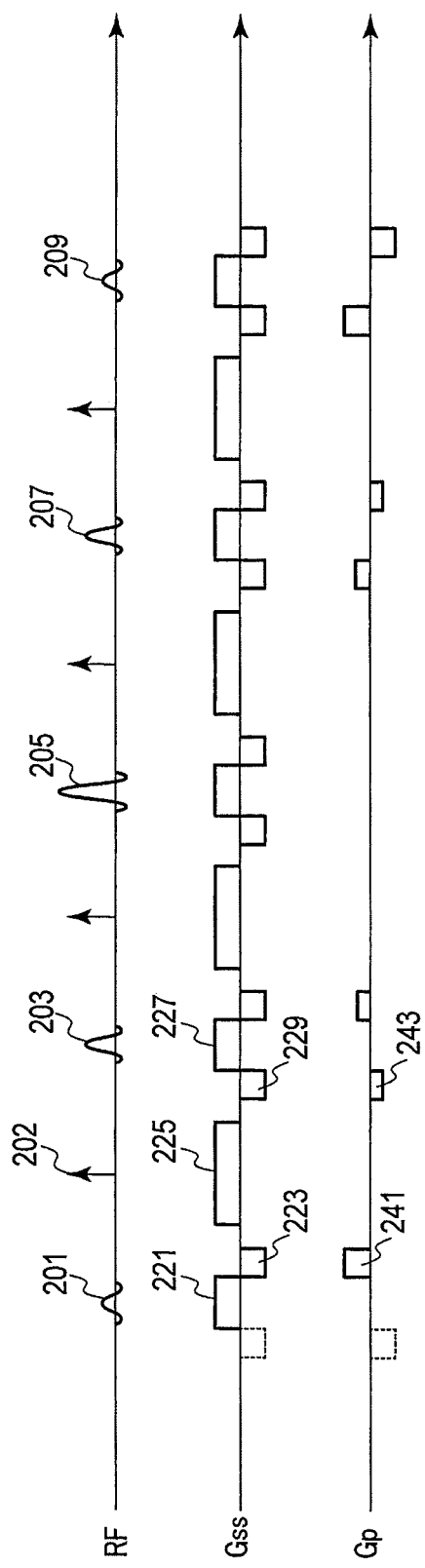
FIG. 2 is a diagram showing an excitation pulse sequence of the magnetic resonance imaging apparatus relating to the first embodiment.

In general, according to one embodiment, a magnetic resonance imaging apparatus includes processing circuitry. The processing circuitry sets an excitation pulse sequence that applies an excitation pulse including an inversion pulse between at least one set of sub pulses of a local excitation radio frequency pulse formed of a plurality of sub pulses, and applies a spoiler gradient magnetic field that disperses transverse magnetization while applying the inversion pulse, the inversion pulse inverting positive and negative of longitudinal magnetization. The processing circuitry controls execution of the excitation pulse sequence by applying the excitation pulse and the spoiler gradient magnetic field according to the excitation pulse sequence. The processing circuitry collects a magnetic resonance signal based on a data collecting sequence after execution of the excitation pulse sequence. The processing circuitry generates a magnetic resonance image using the magnetic resonance signal.

A magnetic resonance imaging (MRI) apparatus and a magnetic resonance imaging method according to the present embodiment will be described with reference to the accompanying drawings. In the embodiments described below, elements assigned with the same reference symbols perform the same operations, and redundant descriptions thereof will be omitted as appropriate.

First Embodiment

An entire configuration of a magnetic resonance imaging apparatus 100 in the present embodiment will be described. FIG. 1 is a diagram showing the configuration of the magnetic resonance imaging apparatus 100 in the present embodiment. As shown in FIG. 1, the magnetic resonance imaging apparatus 100 includes a static field magnet 101, a gradient coil 103, a gradient magnetic field power supply 105, a couch 107, couch control circuitry 109, a transmitter coil 113, a transmitter 115, a receiver coil 117, a receiver 119, sequence control circuitry 121, a bus 123, an interface 125, a display 127, a storage 129, and processing circuitry 131. Note that the magnetic resonance imaging apparatus 100 may include a hollow cylindrical shim coil between the static field magnet 101 and the gradient coil 103.

The static field magnet 101 is a magnet formed into a hollow roughly cylindrical shape. Note that the static field magnet 101 may be configured in an open-type shape without being limited to the roughly cylindrical shape. The static field magnet 101 generates a uniform static magnetic field in an internal space. As the static field magnet 101, for example, a superconducting magnet or the like is used.

The gradient coil 103 is a coil formed into a hollow cylindrical shape. The gradient coil 103 is arranged on an inner side of the static field magnet 101. The gradient coil 103 is formed by combining three coils corresponding to individual axes X, Y and Z that are orthogonal to each other. A Z axis direction is defined as a same direction as the direction of a static magnetic field. In addition, a Y axis direction is defined as a vertical direction, and an X axis direction is defined as a direction vertical to the Z axis and the Y axis. The three coils in the gradient coil 103 individually receive current supply from the gradient magnetic field power supply 105, and generate a gradient magnetic field where magnetic field strength changes along the individual axes X, Y and Z.

The gradient magnetic fields of the individual axes X, Y and Z generated by the gradient coil 103 generate, for example, the gradient magnetic field for frequency encoding (also referred to as a readout gradient magnetic field), the gradient magnetic field for phase encoding, and the gradient magnetic field for slice selection. The gradient magnetic field for slice selection is utilized to determine an imaging cross section. The gradient magnetic field for phase encoding is utilized to change a phase of a magnetic resonance (referred to as MR, hereinafter) signal according to a spatial position. The gradient magnetic field for frequency encoding is utilized to change a frequency of the MR signal according to the spatial position.

The gradient magnetic field power supply 105 is a power supply device which supplies a current to the gradient coil 103 by control of the sequence control circuitry 121.

The couch 107 is a device provided with a couch top 1071 where a subject P is mounted. The couch 107 inserts the couch top 1071 where the subject P is mounted into a bore 111 under the control by the couch control circuitry 109. The couch 107 is installed inside an examination room where the magnetic resonance imaging apparatus 100 is installed such that a longitudinal direction of the couch 107 becomes parallel to a center axis of the static field magnet 101, for example.

The couch control circuitry 109 is circuitry which controls the couch 107, and moves the couch top 1071 in the longitudinal direction and an up-down direction by driving the couch 107 by an instruction of an operator through the interface 125.

The transmitter coil 113 is an RF coil arranged on the inner side of the gradient coil 103. The transmitter coil 113 receives supply of an RF (Radio Frequency) pulse from the transmitter 115, and generates a transmission RF wave equivalent to a high frequency magnetic field. The transmitter coil 113 is, for example, a whole body coil (referred to as a WBC, hereinafter). The WBC may be used as a transmitter/receiver coil. Between the WB coil and the gradient coil 103, a cylindrical RF shield for magnetically separating the coils is installed.

The transmitter 115 supplies the RF pulse corresponding to a Larmor frequency or the like to the transmitter coil 113 by the control of the sequence control circuitry 121.

The receiver coil 117 is an RF coil arranged on the inner side of the gradient coil 103. The receiver coil 117 receives the MR signal emitted from the subject P by the high frequency magnetic field. The receiver coil 117 outputs the received MR signal to the receiver 119. The receiver coil 117 is, for example, a coil array including one or more, typically multiple coil elements. The receiver coil 117 is a phased array coil (also referred to as a PAC, hereinafter), for example.

The receiver 119 generates a digital MR signal which is digitized complex number data, based on the MR signal outputted from the receiver coil 117 by the control of the sequence control circuitry 121. Specifically, the receiver 119 executes various kinds of signal processing to the MR signal outputted from the receiver coil 117, and then executes analog/digital (A/D (Analog to Digital)) conversion to data to which the various kinds of signal processing are executed. The receiver 119 samples the A/D converted data. Thus, the receiver 119 generates the digital MR signal (referred to as MR data, hereinafter). The receiver 119 outputs the generated MR data to the sequence control circuitry 121.

The sequence control circuitry 121 controls the gradient magnetic field power supply 105, the transmitter 115 and the receiver 119 or the like according to an examination protocol outputted from the processing circuitry 131, and performs imaging to the subject P. The examination protocol includes various kinds of pulse sequences according to an examination. In the examination protocol, magnitude of the current supplied to the gradient coil 103 by the gradient magnetic field power supply 105, timing at which the current is supplied to the gradient coil 103 by the gradient magnetic field power supply 105, magnitude of the RF pulse supplied to the transmitter coil 113 by the transmitter 115, timing at which the RF pulse is supplied to the transmitter coil 113 by the transmitter 115, and timing at which the MR signal is received by the receiver coil 117 or the like are defined.

The bus 123 is a transmission line which transmits data among the interface 125, the display 127, the storage 129 and the processing circuitry 131. To the bus 123, various kinds of biological signal measuring instruments, an external storage and various kinds of modalities or the like may be appropriately connected through a network or the like. For example, as the biological signal measuring instrument, an electrocardiograph not shown in the figure is connected to the bus.

The interface 125 includes circuitry which receives various kinds of instructions and information input from the operator. The interface 125 includes, for example, circuitry relating to a pointing device such as a mouse or an input device such as a keyboard. Note that the circuitry included in the interface 125 is not limited to the circuitry relating to a physical operation component such as a mouse or a keyboard. For example, the interface 125 may include electric signal processing circuitry which receives an electric signal corresponding to an input operation from an external input device provided separately from the magnetic resonance imaging apparatus 100 and outputs the received electric signal to various kinds of circuitry.

The display 127 displays various kinds of magnetic resonance images (MR images) generated by an image processing function and various kinds of information regarding imaging and image processing or the like, under the control by a system control function 1311 in the processing circuitry 131. The display 127 is, for example, a cathode ray tube (CRT) display, a liquid crystal display, an organic electro-luminescence (EL) display, a light-emitting diode (LED) display, a plasma display, or a display device such as another arbitrary display or monitor known in the relevant technical field.

The storage 129 stores the MR data arrayed in a k-space through an image processing function 1313 and image data generated by the image processing function 1313 or the like. The storage 129 stores the various kinds of examination protocols, and imaging conditions including a plurality of imaging parameters which stipulate the examination protocols or the like. The storage 129 stores programs corresponding to various kinds of functions executed in the processing circuitry 131. The storage 129 is, for example, a RAM (Random Access Memory), a semiconductor memory element such as a flash memory, a hard disk drive, a solid state drive, or an optical disk. In addition, the storage 129 may be a drive unit which reads and writes various kinds of information from/to a CD-ROM drive, a DVD drive and a portable storage medium such as a flash memory or the like.

The processing circuitry 131 includes a processor not shown in the figure and a memory such as a ROM (Read-Only Memory) or a RAM as hardware resources, and generally controls the magnetic resonance imaging apparatus 100. The processing circuitry 131 is provided with the system control function 1311, the image processing function 1313, and a setting function 1315. The various kinds of functions performed by the system control function 1311, the image processing function 1313 and the setting function 1315 are stored in the storage 129 in a form of the programs executable by a computer. The processing circuitry 131 is a processor which achieves the functions corresponding to the individual programs by reading and executing the programs corresponding to the various kinds of functions from the storage 129. In other words, the processing circuitry 131 in a state of reading the individual programs is provided with the plurality of functions shown inside the processing circuitry 131 in FIG. 1 or the like.

Note that, while it is described that the various kinds of functions are achieved in the single processing circuitry 131 in FIG. 1, the processing circuitry 131 may be configured by combining a plurality of independent processors and the functions may be achieved by the individual processors executing the programs. In other words, the respective functions described above are configured as the programs, and there may be a case where one piece of processing circuitry executes the individual programs or there may be a case where a specific function is mounted on exclusive and independent program execution circuitry.

The word "processor" used in the description above means, for example, a central processing unit (CPU), a graphics processing unit (GPU) or circuitry such as an application specific integrated circuit (ASIC), a programmable logic device (for example, a simple programmable logic device (SPLD)), a complex programmable logic device (CPLD) and a field programmable gate array (FPGA).

The processor achieves the various kinds of functions by reading and executing the programs saved in the storage 129. Note that, instead of saving the programs in the storage 129, the programs may be directly incorporated in the circuitry of the processor. In this case, the processor achieves the functions by reading and executing the programs incorporated in the circuitry. Note that the couch control circuitry 109, the transmitter 115, the receiver 119 and the sequence control circuitry 121 or the like are similarly configured by electronic circuitry such as the processor described above.

The processing circuitry 131 controls the magnetic resonance imaging apparatus 100 by the system control function 1311. Specifically, the processing circuitry 131 reads a system control program stored in the storage 129, deploys the program on the memory, and controls the individual circuitry of the magnetic resonance imaging apparatus 100 according to the deployed system control program. For example, the processing circuitry 131 reads the examination protocol from the storage 129, based on the imaging condition inputted from the operator through the interface 125 by the system control function 1311. Note that the processing circuitry 131 may generate the examination protocol based on the imaging condition. The processing circuitry 131 transmits the examination protocol to the sequence control circuitry 121 and controls imaging to the subject P.

In the case of applying an excitation pulse including a plurality of RF pulses, the processing circuitry 131 applies an inversion pulse between at least one set of RF pulses among the plurality of RF pulses by executing the setting function 1315. The inversion pulse is the RF pulse which inverts positive/negative of longitudinal magnetization and reverses a relation of phase advance/delay of transverse magnetization, and is also referred to as a 180° pulse or a refocus pulse. In addition, in order to suppress generation of an artifact by a free induction decay (FID) signal generated from the inversion pulse itself, a gradient magnetic field in a slice direction is applied before, after or while applying the inversion pulse. For the gradient magnetic field, in order to suppress phase dispersion of the transverse magnetization in the slice direction and maintain an S/N of an image, an area of the gradient magnetic field needs to be identical before and after the inversion pulse. In present embodiment, the gradient magnetic field pulse is referred to as a flop spoiler. In addition, in the case of using the plurality of inversion pulses, in order to minimize influence of the FID signals generated from the inversion pulses themselves, for the spoiler before and after the plurality of inversion pulses, a time integrated value (area) is turned to a same value (same area size) for each of the respective inversion pulses.

The processing circuitry 131 performs the control to apply the excitation pulse according to an excitation pulse sequence and apply the gradient magnetic field including the spoiler gradient magnetic field, by executing the system control function 1311. The processing circuitry 131 generates the MR data by collecting the MR signal from the subject P according to the data collecting sequence which is a pulse sequence for collecting various kinds of data, after executing the excitation pulse sequence, by the system control function 1311.

The processing circuitry 131 fills the MR data along a readout direction of the k-space according to the strength of the readout gradient magnetic field by executing the image processing function 1313. The processing circuitry 131 generates the MR image by performing the inverse Fourier transformation to the MR data filled in the k-space. For example, the processing circuitry 131 can generate an absolute value (magnitude) image from complex MR data. In addition, the processing circuitry 131 can generate a phase image by using real part data and imaginary part data in the complex MR data. The processing circuitry 131 outputs the MR image such as the absolute value image and the phase image to the display 127 and the storage 129.

Next, the excitation pulse sequence of the magnetic resonance imaging apparatus 100 relating to the first embodiment will be described with reference to FIG. 2.

A sequence diagram shown in FIG. 2 shows individual time sequences of the RF pulse, the gradient magnetic field for slice selection (a gradient magnetic field Gss), and the gradient magnetic field for phase encoding (a gradient magnetic field Gp) in order from the top.

For the excitation pulse used in the first embodiment, a two-dimensional local excitation pulse which selectively excites nuclear magnetization moments of an interior of a slice surface is assumed. The excitation pulse includes the plurality of RF pulses as sub pulses. Here, the excitation pulse for local excitation is formed by five sub pulses 201, 203, 205, 207 and 209. Also, in an example shown in FIG. 2, the third sub pulse 205 is defined as a main pulse, and the excitation pulse sequence is set such that a configuration of the sub pulses and the gradient magnetic fields becomes symmetrical before and after the main pulse at a center on the time sequence. Note that the position of main pulse is not limited. The last sub pulse on the time sequence, the sub pulse 209 here, may be set to be the main pulse.

Hereinafter, it is assumed that the excitation pulse sequence set by the setting function 1315 is executed by the sequence control circuitry 121 controlling the individual circuitry.

In the gradient magnetic field for slice selection, when the first sub pulse 201 is applied, a positive gradient magnetic field Gss211 is applied. After the gradient magnetic field Gss221 is applied, in order to arrange the phase of local magnetization within the slice surface, a negative gradient magnetic field Gss223 equivalent to a half of the area (gradient moment: GM) of an area (also referred to as a pulse, hereinafter) surrounded by a line indicating the strength of a magnetic field gradient of the gradient magnetic field Gss221 and a base line of the time sequence is applied. That is, the area corresponds to an integrated value over an application period of the strength of the magnetic field gradient for each gradient magnetic field Gss221.

In the gradient magnetic field for phase encoding, at the timing at which the gradient magnetic field Gss223 is applied, a gradient magnetic field Gp241 is applied for selection in a phase encoding direction in the k-space.

Next, between the first sub pulse 201 and the second sub pulse 203, an inversion pulse 202 is applied. By application of the inversion pulse 202, positive/negative of the longitudinal magnetization is inverted. In other words, the longitudinal magnetization is inverted between a positive value and a negative value.

Here, in the case that the inversion pulse 202 is applied, the transverse magnetization is generated. Thus, in order to eliminate the generated transverse magnetization, a spoiler gradient magnetic field Gss225 is applied in the gradient magnetic field for slice selection together with the application of the inversion pulse 202.

Note that, by executing the setting function 1315, the processing circuitry 131 sets a pulse area of the spoiler gradient magnetic field Gss225 to such a pulse area as to be equal before and after the timing at which the inversion pulse 202 is applied at the center on the time sequence. In addition, by executing the setting function 1315, the processing circuitry 131 sets the application timing of the inversion pulse 202 so that a phase difference between the RF pulses becomes equal to or smaller than a threshold at the timing at which the RF pulse is applied. Preferably, the application timing of the inversion pulse 202 may be set so that the phase difference becomes zero at the application timing of each of the plurality of sub pulses 201.

Next, the second sub pulse 203 is applied. Together with the application of the sub pulse 203, in the gradient magnetic field for slice selection, a positive gradient magnetic field Gss227 is applied. Note that, before the positive gradient magnetic field 227 is applied, a negative gradient magnetic field Gss229 to be a half of the pulse area of the positive gradient magnetic field Gss227 is applied. In addition, together with the negative gradient magnetic field Gss229, in the gradient magnetic field for phase encoding, a negative gradient magnetic field 243 is applied. It is to adjust an excitation start position on the k-space.

Thereafter, the excitation pulse sequence described above is repeated along a trajectory on the k-space corresponding to the local excitation. That is, the inversion pulse is applied between the individual pulses of the plurality of sub pulses.

Next, a phase diagram indicating a phase change in a slice selecting direction and a phase change in the phase encoding direction relating to the first embodiment will be described with reference to FIG. 3.

Figure 3:
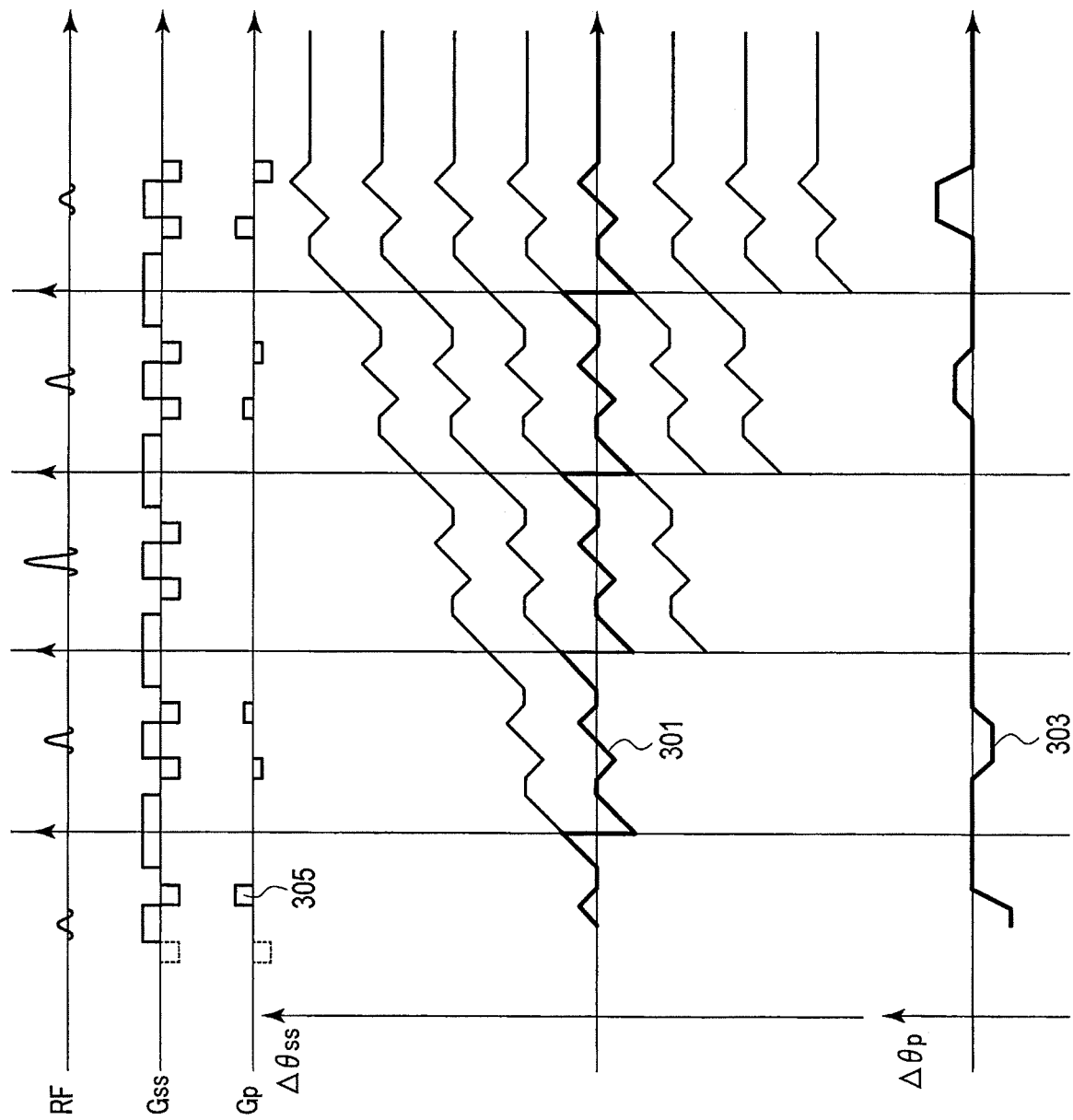
FIG. 3 is a diagram showing a phase diagram indicating a phase change in a slice selecting direction and a phase change in a phase encoding direction relating to the first embodiment.

An upper part of FIG. 3 is the excitation pulse sequence shown in FIG. 2. A middle part of FIG. 3 is a graph 301 indicating a phase difference Δθss of the magnetization in the slice selecting direction along the time sequence. A lower part of FIG. 3 is a graph 303 indicating a phase difference Δθp of the magnetization in the phase encoding direction along the time sequence.

As shown in FIG. 3, in proportion to application time of the gradient magnetic field for slice selection, the phase of the magnetization in the slice selecting direction is inverted at the timing at which the inversion pulse 202 is applied. Since the magnetization whose phase is not inverted by the inversion pulse 202 also exists, the graph 301 is branched into two every time the inversion pulse is applied. In addition, the sub pulse is applied at the timing at which a shift amount of the phase in the slice selecting direction becomes zero.

At the timing at which the sub pulse 201 is applied, the magnetic field for phase encoding is applied so that an encoding amount becomes different for each sub pulse 201. In addition, before the inversion pulse 202 is applied, the magnetic field for phase encoding referred to as a rewinder 305 is applied for each inversion pulse so that the encoding amount in the phase encoding direction becomes zero.

Figure 4:
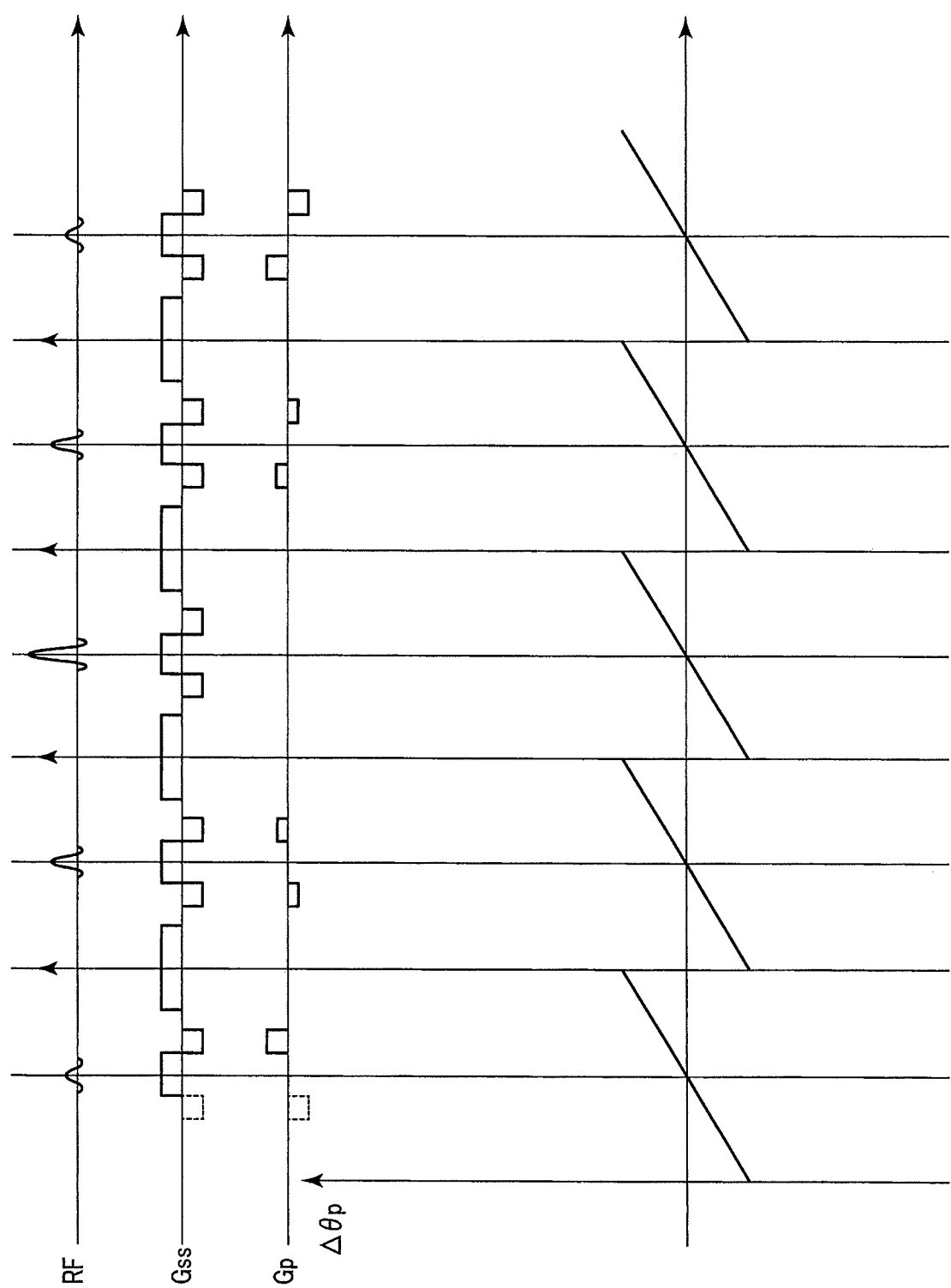
FIG. 4 is a diagram showing the excitation pulse sequence and a phase change of magnetization due to influence of static magnetic field inhomogeneity relating to the first embodiment.

Next, the excitation pulse sequence and the phase change of the magnetization due to influence of static magnetic field inhomogeneity relating to the first embodiment are shown in FIG. 4.

The upper part of FIG. 4 shows the excitation pulse sequence shown in FIG. 2. The lower part of FIG. 4 shows the phase change of a static magnetic field $B_0$ along the time sequence. Since the relation of advance/delay of the phase of the transverse magnetization is reversed by the inversion pulse 202, the individual sub pulses are applied when the phase change due to the static magnetic field inhomogeneity is offset. Thus, since the phase difference is not generated in the case of applying the individual sub pulses, degradation of a local excitation characteristic can be reduced.

According to the first embodiment described above, in two-dimensional local excitation which is a kind of the excitation pulse sequence accompanied by the application of the plurality of sub pulses, the inversion pulse is applied between the sub pulses, and the spoiler gradient magnetic field is applied at the application timing of the inversion pulse. Thus, while suppressing the generation of the FID signal accompanying the application of the inversion pulse by the application of the spoiler gradient magnetic field, a phase shift resulting from phase rotation of the magnetization can be reduced at the application timing of the sub pulse.

In the magnetic field inhomogeneity, a frequency offset is generated between spatial positions and an excitation position is shifted in a local excitation direction since the phase of the magnetization is rotated based on the frequency offset, however, according to the first embodiment, the local excitation position is not shifted in the local excitation direction and characteristic degradation of the excitation pulse in the two-dimensional local excitation can be reduced. Eventually, image quality of the magnetic resonance image can be improved.

Second Embodiment

In the second embodiment, a point that the negative gradient magnetic field is applied as the gradient magnetic field for slice selection at the timing at which the sub pulse is applied is different from the first embodiment.

Figure 5:
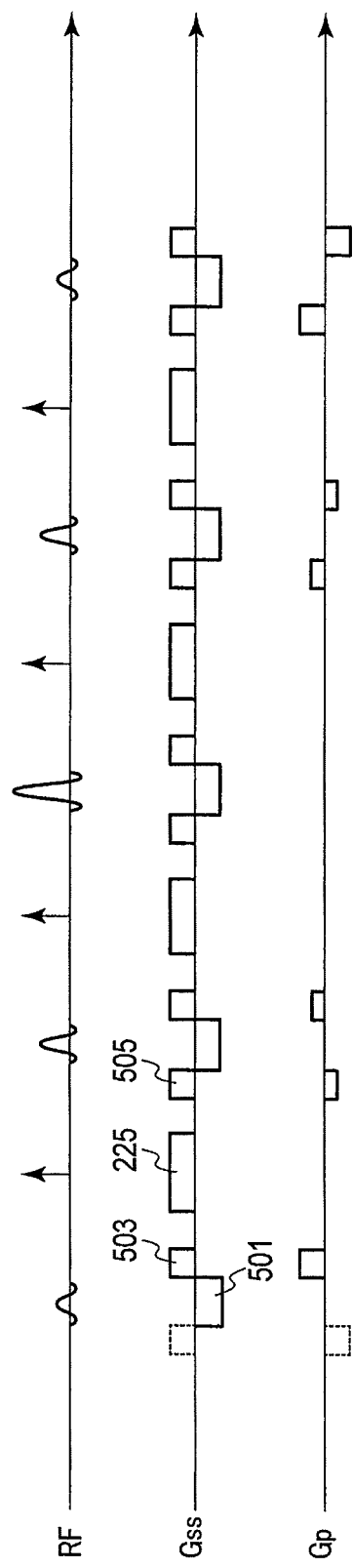
FIG. 5 is a diagram showing an excitation pulse sequence of a magnetic resonance imaging apparatus relating to a second embodiment.

An excitation pulse sequence of a magnetic resonance imaging apparatus 100 relating to the second embodiment is shown in FIG. 5.

By a setting function 1315, processing circuitry 131 is designed to apply a negative gradient magnetic field 501 as the gradient magnetic field for slice selection at the timing at which the sub pulse is respectively applied. Since the negative gradient magnetic field 501 is applied, a gradient magnetic field Gss503 for arranging the phase of the local magnetization within the slice surface is a positive gradient magnetic field of an opposite polarity. Further, a positive gradient magnetic field Gss505 for determining the excitation start position on the k-space is also the positive gradient magnetic field. Thus, since the polarity of the gradient magnetic field Gss503, the gradient magnetic field Gss505 and a positive spoiler gradient magnetic field 225 applied at the timing at which the inversion pulse is applied is the same, a pulse interval can be shortened without need of switching the gradient magnetic field for slice selection.

Figure 6:
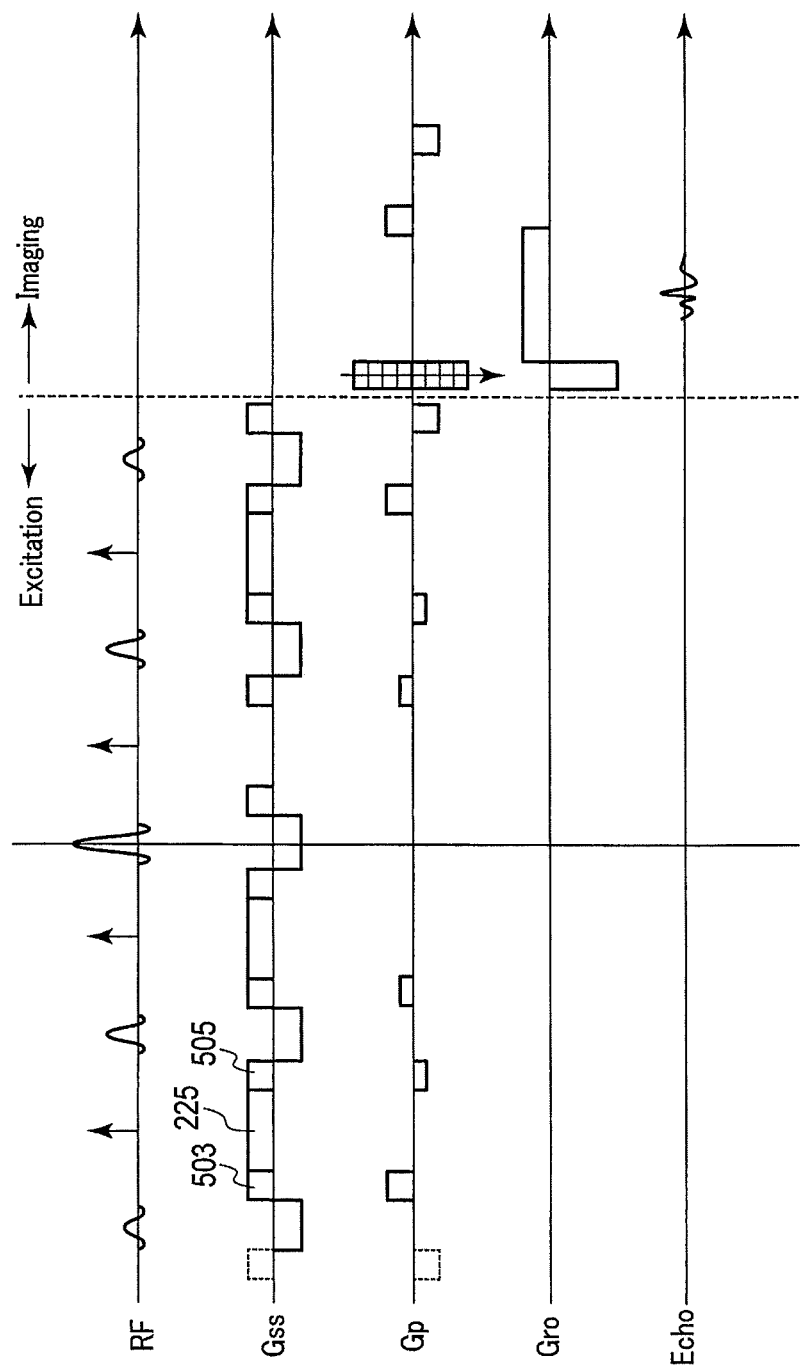
FIG. 6 is a diagram showing the excitation pulse sequence in the case of shortening a pulse interval relating to the second embodiment.

Next, an excitation pulse sequence relating to the second embodiment in the case of shortening the pulse interval is shown in FIG. 6.

As shown in FIG. 6, the positive gradient magnetic field Gss503, the spoiler gradient magnetic field Gss225 and the positive gradient magnetic field Gss505 become the continuous gradient magnetic field.

Also, in addition to the excitation pulse sequence, a data collecting sequence of collecting the MR signal and generating the MR image is described as well. In an example in FIG. 6, the case of imaging by a field echo method (FE, also referred to as a gradient echo (GRE) method) is shown. Thus, in the lower part of the gradient magnetic field for phase encoding, the time sequence of the gradient magnetic field for readout is shown, and the time sequence regarding echo is shown in the further lower part.

According to the second embodiment described above, by turning the gradient magnetic field for slice selection when the sub pulse is applied to the negative gradient magnetic field, the spoiler gradient magnetic field 225, the gradient magnetic field Gss503 and the gradient magnetic field Gss505 become the continuous gradient magnetic field, and the sub pulse interval can be shortened. Thus, the application time of the excitation pulse sequence can be shortened.

Third Embodiment

In the third embodiment, a point that the gradient magnetic field for slice selection is continuously applied during the application of the excitation pulse is different from the above-described embodiments.

Figure 7:
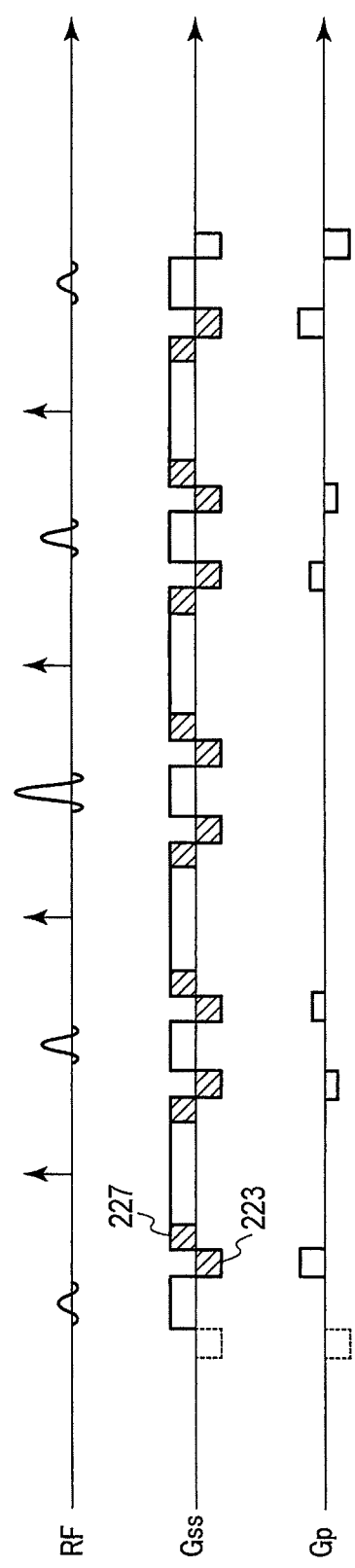
FIG. 7 is a diagram showing an excitation pulse sequence of a magnetic resonance imaging apparatus relating to a third embodiment.

An excitation pulse sequence of a magnetic resonance imaging apparatus relating to the third embodiment is shown in FIG. 7.

In the RF pulse sequence in FIG. 2 relating to the first embodiment, the negative gradient magnetic field 223 is applied by the gradient magnetic field for slice selection right after the positive gradient magnetic field Gss221. Here, it is assumed to add a gradient magnetic field 227 of the same area as the negative gradient magnetic field 223 and of the positive polarity before and after the flop spoiler.

In this case, the negative gradient magnetic field 223 and the added positive gradient magnetic field 227 indicated by slant lines in FIG. 7 can be offset. The interval of the sub pulses and the inversion pulse can be shortened for the application time of the offset gradient magnetic fields.

Figure 8:
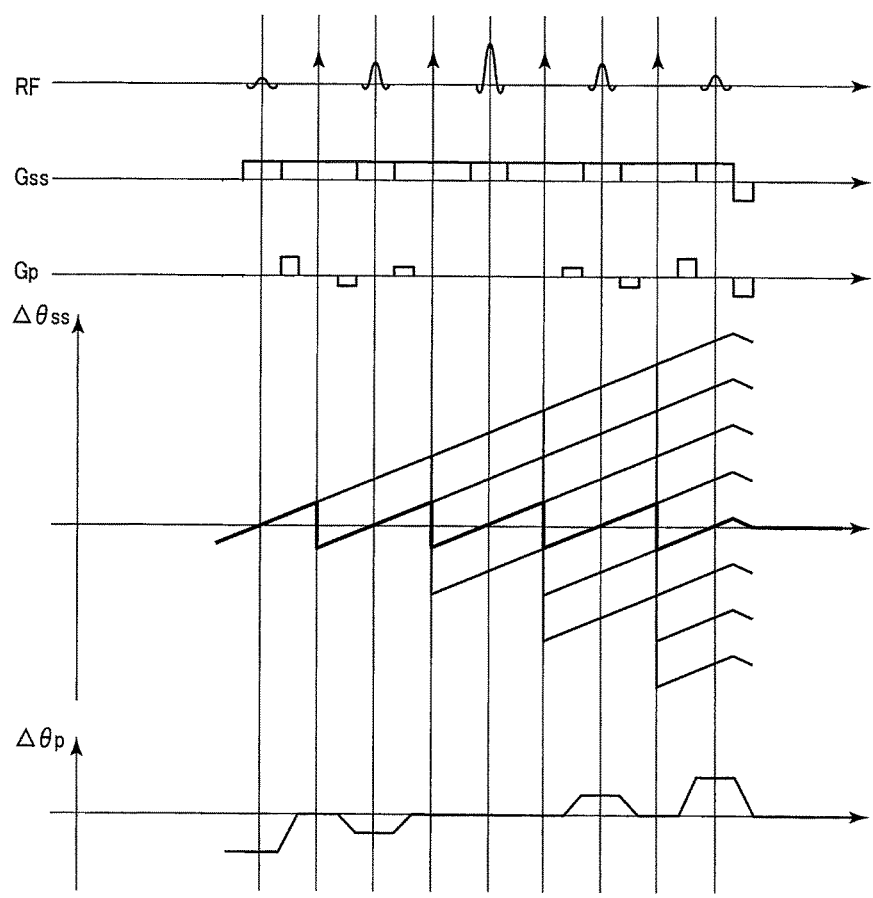
FIG. 8 is a diagram showing the excitation pulse sequence in the case of shortening the pulse interval and phase changes in the slice selecting direction and the phase encoding direction relating to the third embodiment.

Next, the excitation pulse sequence and the phase changes in the slice selecting direction and the phase encoding direction relating to the third embodiment in the case of shortening the pulse interval are shown in FIG. 8.

The upper part of FIG. 8 shows the excitation pulse sequence of the excitation pulse relating to the third embodiment, the middle part of FIG. 8 shows the phase difference of the magnetization in the slice selecting direction, and the lower part of FIG. 8 shows the phase difference of the magnetization in the phase encoding direction.

As shown in FIG. 8, by a setting function 1315, processing circuitry 131 performs setting so as to continuously apply the positive gradient magnetic field as the gradient magnetic field for slice selection during the application period of the excitation pulse. Since it is a state where the positive gradient magnetic field for slice selection is applied, the phase difference of the magnetization in the slice selecting direction increases until the inversion pulse is applied. After the inversion pulse is applied, the phase is inverted, and the phase difference becomes zero at the timing at which the sub pulse is applied.

The phase difference of the magnetization in the phase encoding direction is similar to the case of FIG. 4, and a rewinder gradient magnetic field is applied so that the phase encoding amount becomes zero before the inversion pulse is applied.

Figure 9:
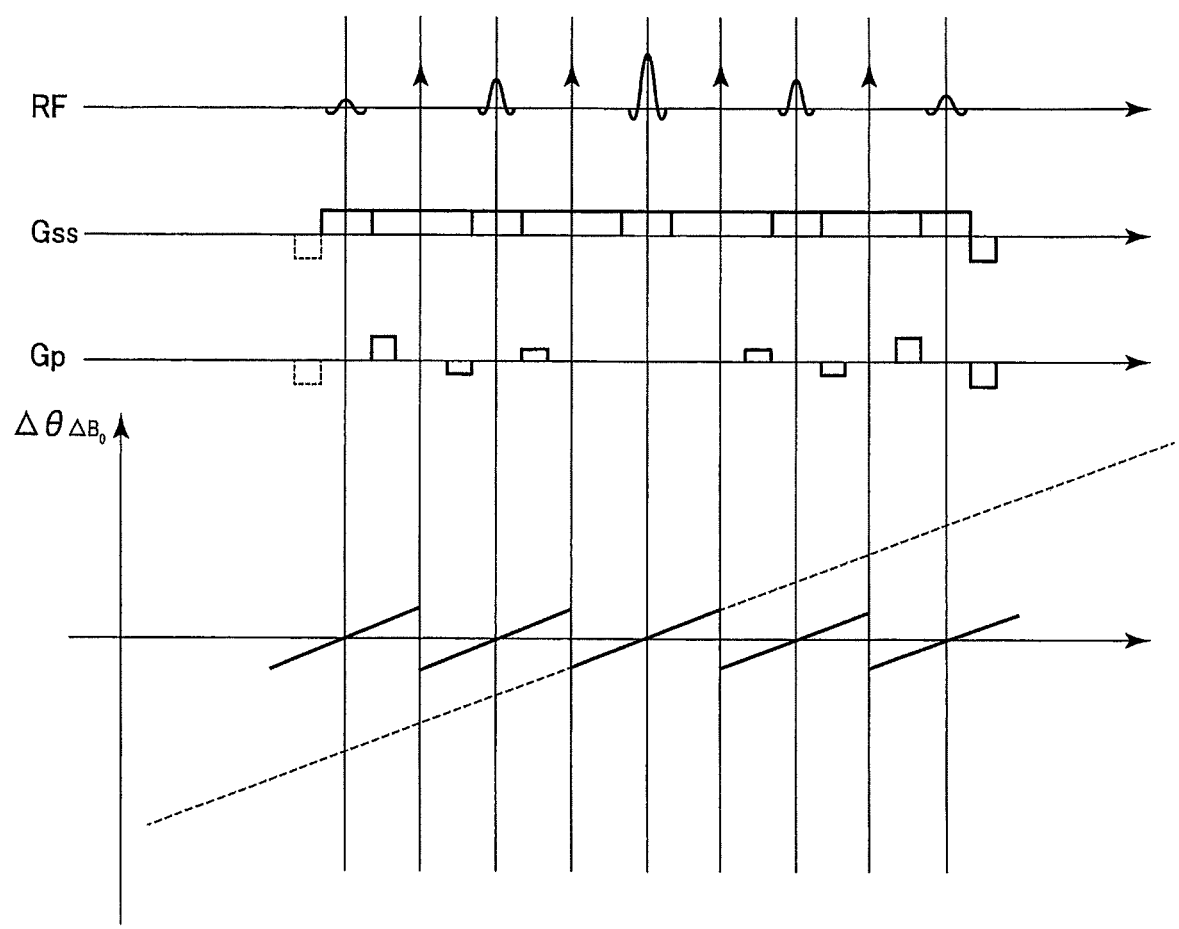
FIG. 9 is a diagram showing the excitation pulse sequence and the phase change of the magnetization due to the influence of the static magnetic field inhomogeneity relating to the third embodiment.

Next, the excitation pulse sequence and the phase change of the magnetization due to the influence of the static magnetic field inhomogeneity relating to the third embodiment are shown in FIG. 9.

The upper part of FIG. 9 shows the RF pulse sequence for local excitation, and the lower part of FIG. 9 shows the phase change of the magnetization. A broken line in the lower part of FIG. 9 indicates the phase change when the inversion pulse is not applied. By the inversion pulse, the individual sub pulse is applied when the phase change due to the static magnetic field inhomogeneity is offset. Thus, the degradation of the local excitation characteristic due to the phase shift can be reduced.

Here, an example of the trajectory of the k-space by the excitation pulse sequence relating to the third embodiment will be described with reference to FIG. 10.

Figure 10:
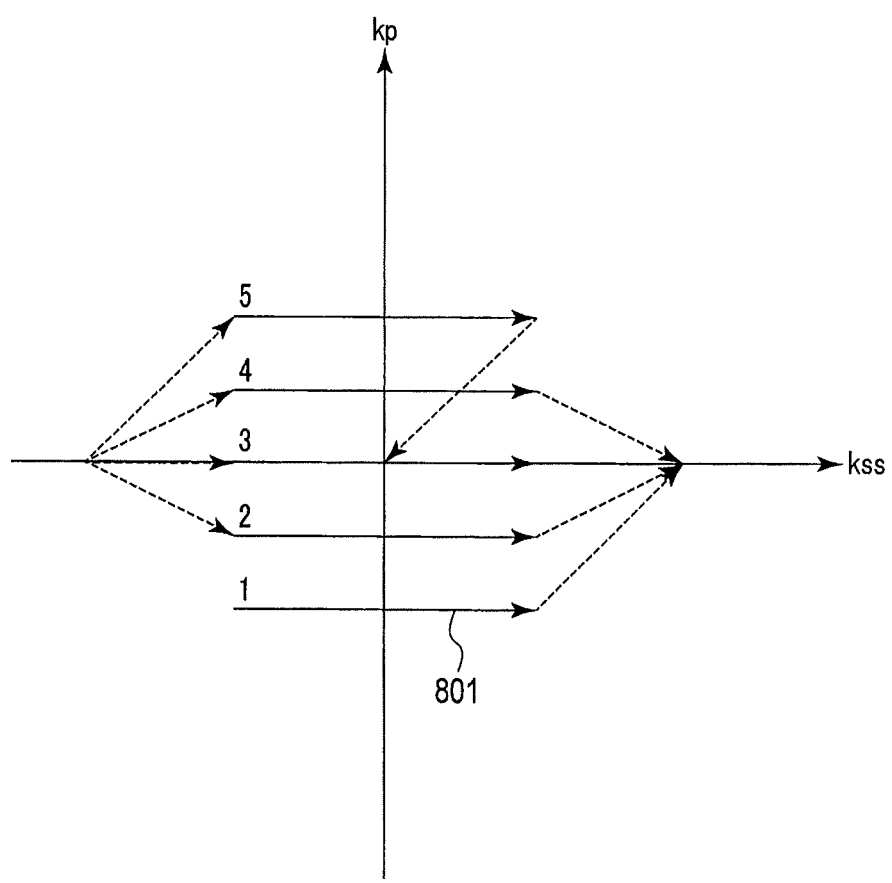
FIG. 10 is a diagram showing an example of a trajectory of a k-space by the excitation pulse sequence relating to the third embodiment.

FIG. 10 shows the k-space in which a horizontal axis is the slice selecting direction and a vertical axis is the phase encoding direction. Arrows from "1" to "5" indicate a trajectory 801 on the k-space.

By using the inversion pulse, in the gradient magnetic field for slice selection, even in the state where the positive gradient magnetic field is continuously applied, the trajectory needed for the local excitation can be drawn on the k-space.

Note that, while the case of continuously applying the positive gradient magnetic field is described in the third embodiment, the negative gradient magnetic field may be continuously applied.

According to the third embodiment described above, in the gradient magnetic field for slice selection, the negative gradient magnetic field is not applied, and the positive gradient magnetic field is applied at the application timing of the sub pulse of the excitation pulse sequence. Thus, in the gradient magnetic field for slice selection, a fixed gradient magnetic field may be applied so that the processing can be simplified without the need of switching the gradient magnetic field. Further, since the interval of the sub pulses and the inversion pulses can be shortened, the application time of the excitation pulse sequence can be shortened.

In the case of using a fast spin echo method, a GRASE (Gradient and Spin Echo) method, or a multi echo method utilizing a CPMG (Carr-Purcell Meiboom-Gill) method or the like as the data collecting sequence, the plurality of inversion pulses are used for data collection as well. In the case of using the imaging sequences and the excitation pulse sequence described above together, the following point should be taken into consideration.

As described above, in the case of using the plurality of inversion pulses, in order to minimize the influence of the FID signals generated from the inversion pulses themselves, it is desirable to turn the time integrated value (pulse area) to the same value for each of the respective inversion pulses for the spoiler before and after the plurality of inversion pulses. However, in the case of using the excitation pulse sequence and the data collecting sequence together, it is desirable to match the pulse area of the spoiler before and after the inversion pulse on the data collecting sequence side with the pulse area of the spoiler before and after the inversion pulse on the excitation pulse sequence side.

Figure 11:
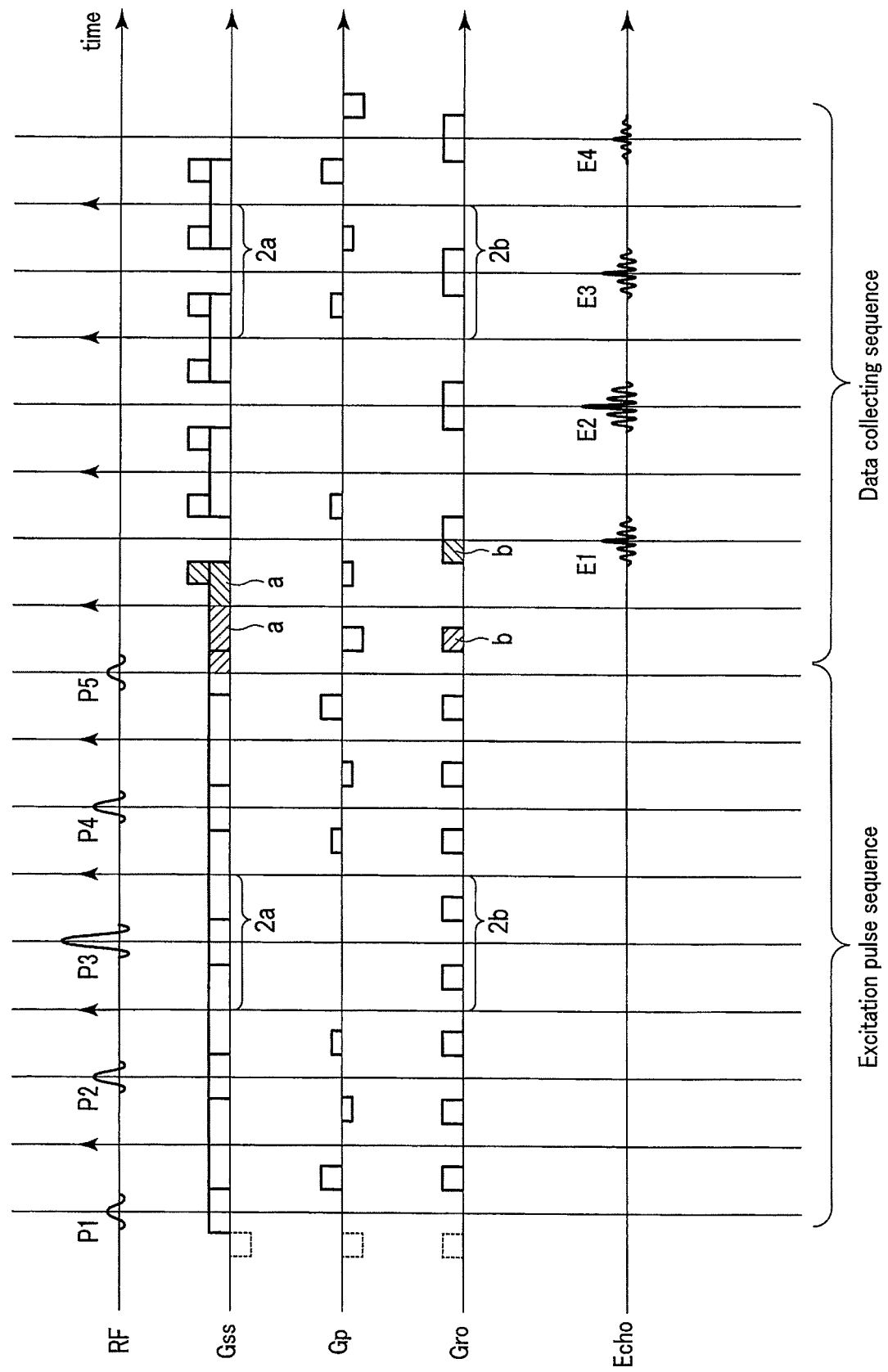
FIG. 11 is a sequence diagram showing a combination of the excitation pulse sequence and a data collecting sequence in the case of using a spin echo method as the data collecting sequence.

An example of combining the excitation pulse sequence relating to the present embodiment and a 4-echo fast spin echo method is shown in FIG. 11. In FIG. 11, in the gradient magnetic field Gss in the slice direction, the areas of two kinds of slant line parts are matched. Here, it is defined as the area "a". In addition, the areas of Gss between the inversion pulses where the excitation pulse sequence and the data collecting sequence are adjacent are matched and all turned to 2a (two times a) as in FIG. 11.

Similarly, at the part of the gradient magnetic field Gro in the readout direction, the areas of two kinds of slant line parts are matched and defined as the area "b". In addition, the areas of Gro between the inversion pulses where the excitation pulse sequence and the data collecting sequence are adjacent are matched and all turned to 2b (two times b) as in FIG. 11.

Like the gradient magnetic field Gp in the phase encoding direction, in a channel which needs phase encoding, the areas of the parts corresponding to the slant lines in the gradient magnetic field Gss and the gradient magnetic field Gro cannot be matched. However, the areas between the inversion pulses where the excitation pulse sequence and the data collecting sequence are adjacent are designed so as to be all offset in positive/negative. Specifically, since the area of the gradient magnetic field Gp before irradiation of the last RF pulse "P5" of the excitation pulse sequence is positive and the area of the gradient magnetic field Gp relating to the data collecting sequence after the irradiation of the RF pulse "P5" is negative, the areas are offset in positive/negative and constancy is maintained. Note that it is also desirable to constantly match the time intervals of the adjacent inversion pulses at the same interval between the excitation pulse sequence and the data collecting sequence.

When it is difficult to match the pulse area, a relation of an odd number multiple of the pulse area to be a reference may be attained. In this case, the interval of the adjacent inversion pulses may be also turned to the interval of the odd number multiple according to the area ratio.

As shown in FIG. 11, by maintaining the relation of the pulse area and the relation of the time interval of the inversion pulses described above as much as possible, the FID signals generated from the inversion pulses are appropriately suppressed and do not easily mix in an echo sampling window, and the images of the high image quality with fewer artifacts and signal value irregularities are obtained.

Fourth Embodiment

In the fourth embodiment, the excitation pulse sequence for the two-dimensional local excitation is applied to a Spoke method.

The Spoke method is a technique of suppressing inhomogeneity of a $B_1$ distribution by the $B_1$ distribution which can be generated by slice selecting pulses distributed on the k-space. When a flip angle is small, by STA (Small Tip Angle) approximation, the transverse magnetization can be linearly approximated using magnitude $M_0$ of a magnetization vector. Thus, Bloch equations can be simplified so that the k-space and real space can be considered as a Fourier transformation pair.

Figure 12:
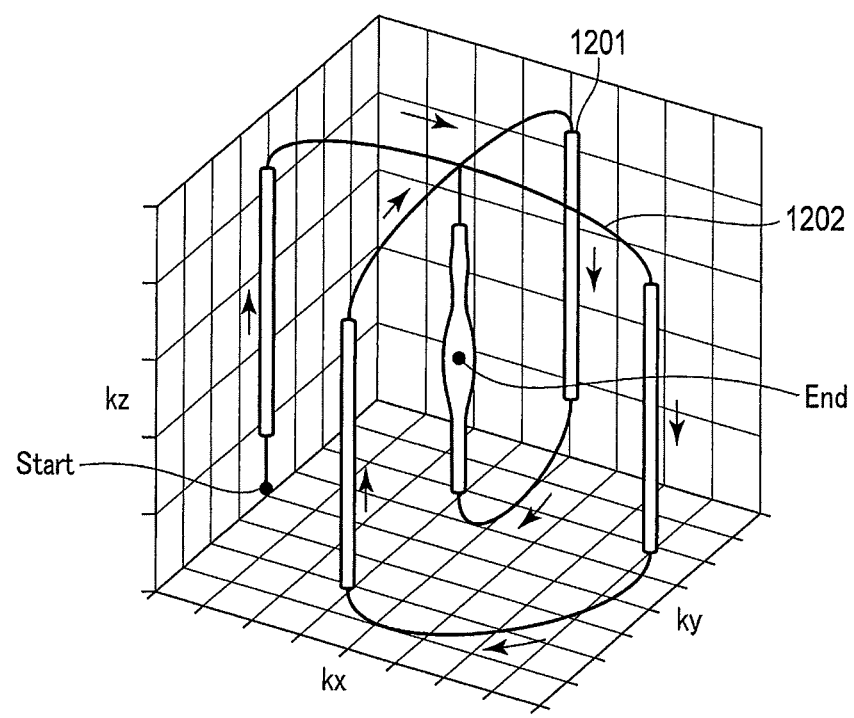
FIG. 12 is a diagram explaining a concept of a trajectory of a spoke method on the k-space.

A concept of the trajectory of the Spoke method on the k-space is shown in FIG. 12.

In the Spoke method, there is a line (a point when viewed on a $k_x$-$k_y$ plane) of an impulse (delta function) parallel to a $k_z$ axis on the k-space, and the line is also referred to as a Spoke. In an example in FIG. 12, there are five Spokes 1201, and the individual Spokes 1201 are connected (selected) along a trajectory 1202 from a position "start" to a position "end". The trajectory 1202 indicates positions of the Spokes 1201 on the k-space expressed by a $k_x$ axis, a $k_y$ axis and the $k_z$ axis and an application order of the RF pulse corresponding to the Spokes 1201.

To the individual Spoke 1201, a parameter (an amplitude and a phase) of the RF pulse corresponding to the position on the k-space of the individual Spoke 1201 is made to correspond. The RF pulse provided with the amplitude and the phase corresponding to the individual Spoke 1201 is applied as the sub pulse. That is, the RF pulse is set such that the plurality of sub pulses become one excitation pulse as a whole. Note that the Spoke method is sometimes referred to simply as Spoke.

In the example of FIG. 12, the example of using five Spokes is shown, but without being limited thereto, three or more Spokes 1201 including the Spoke of an origin on the k-space to be used for offsetting may be used. Note that, when the number of the Spokes 1201 is large, the number of the sub pulses to be applied increases for that and it takes time to become the excitation pulse so that the number of the Spokes 1201 may be appropriately set in consideration of imaging time.

Next, the excitation pulse sequence of the Spoke method relating to the fourth embodiment will be described with reference to FIG. 13 and FIG. 14.

Figure 13:
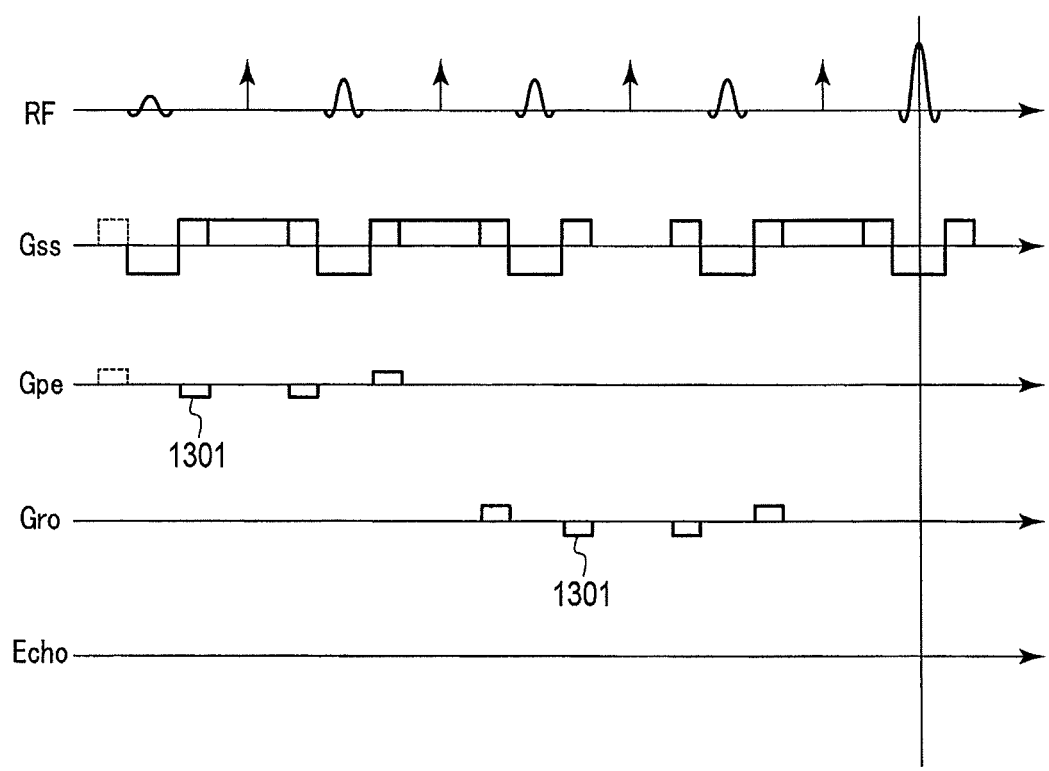
FIG. 13 is a diagram showing an excitation pulse sequence for which the excitation pulse sequence relating to the second embodiment is applied to the spoke method.

FIG. 13 is the excitation pulse sequence for which the excitation pulse sequence shown in the second embodiment is applied to the Spoke method. That is, the plurality of sub pulses are the excitation pulse used in the Spoke method. In the Spoke method, since the gradient magnetic field is applied in a frequency encoding direction as well, a time sequence of the gradient magnetic field for readout is added.

For both of the gradient magnetic field for phase encoding and the gradient magnetic field for frequency encoding, a rewinder gradient magnetic field 1301 is applied before the inversion pulse is applied.

Figure 14:
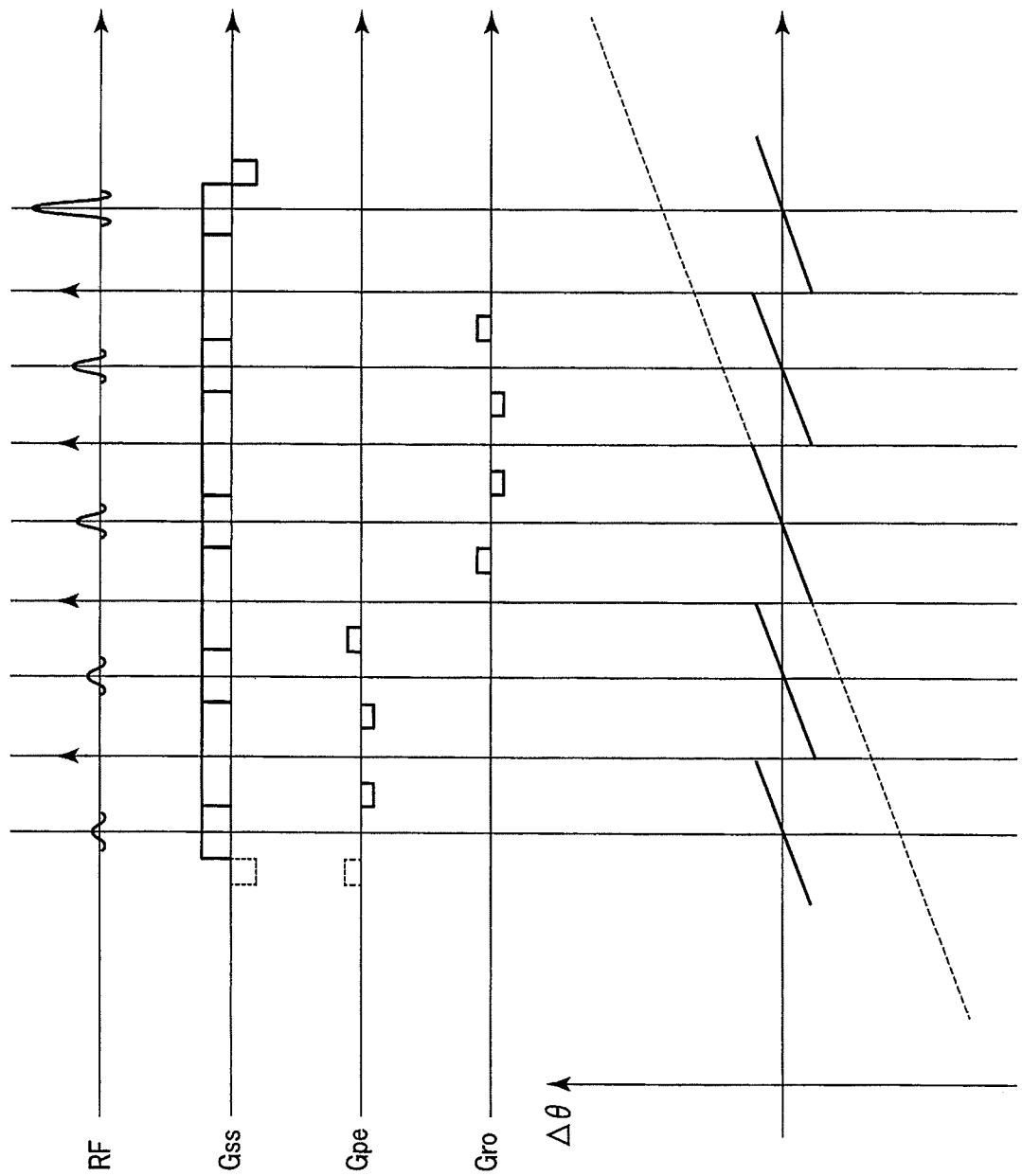
FIG. 14 is a diagram showing an excitation pulse sequence for which the excitation pulse sequence relating to the third embodiment is applied to the spoke method.

Next, the excitation pulse sequence for which the excitation pulse sequence shown in the third embodiment is applied to the Spoke method is shown in FIG. 14.

Similarly to the case shown in FIG. 13, by continuously applying the gradient magnetic field for slice selection even in the excitation pulse sequence using the Spoke method, the influence of the phase shift due to the static magnetic field inhomogeneity in a $B_1$ distribution characteristic can be reduced.

Figure 15:
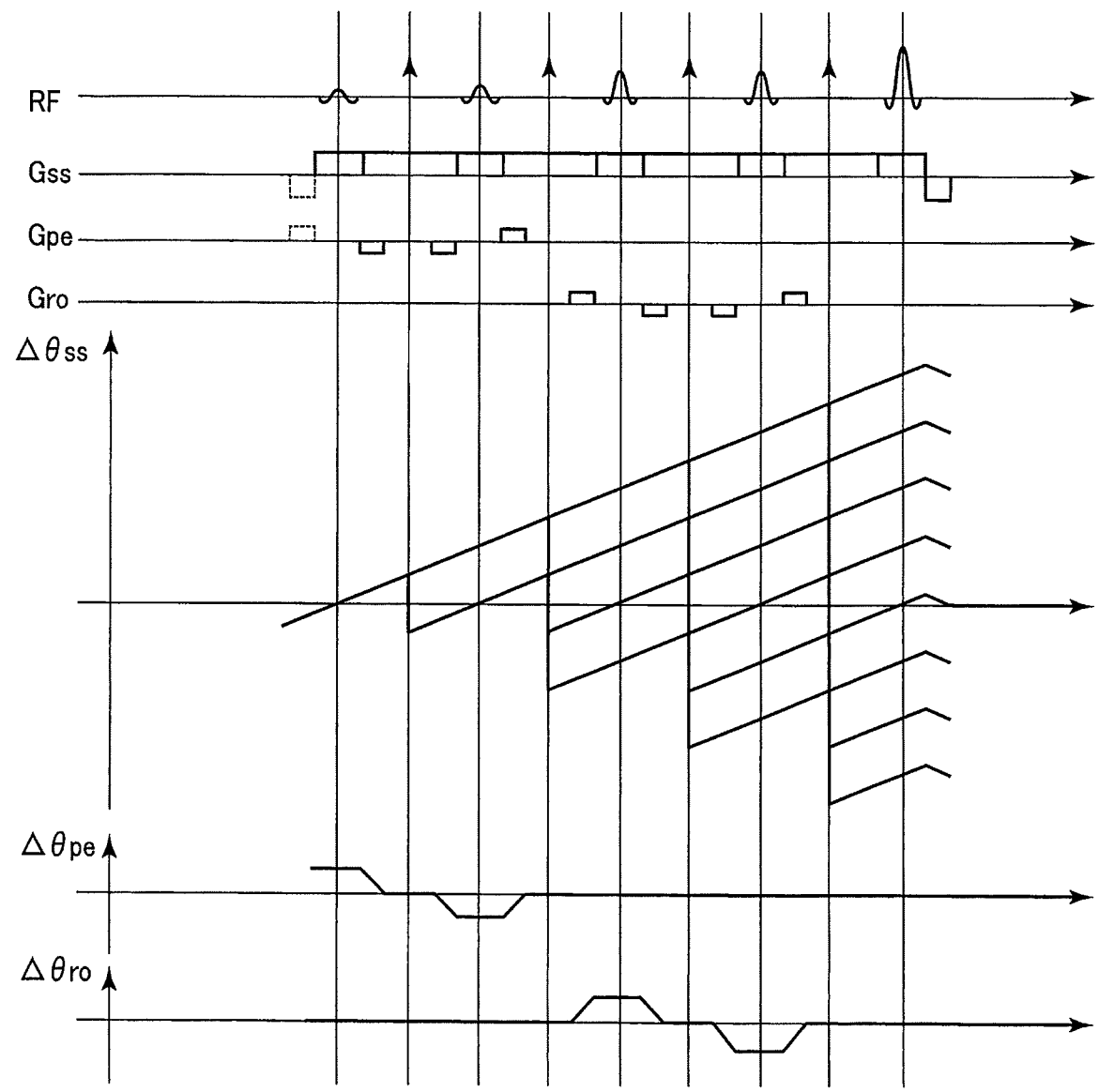
FIG. 15 is a diagram showing a phase diagram indicating the phase change in the slice selecting direction and the phase change in the phase encoding direction relating to a fourth embodiment.

Next, a phase diagram indicating the phase change in the slice selecting direction and the phase change in the phase encoding direction relating to the fourth embodiment is shown in FIG. 15.

As shown in FIG. 15, even in the case of the application to the Spoke method, the phase change similarly to the two-dimensional local excitation can be taken into consideration. Note that, at the timing at which the inversion pulse is applied, the rewinder gradient magnetic field is applied in the frequency encoding direction and the phase encoding direction.

According to the fourth embodiment described above, in the case of the Spoke method as well, since the individual sub pulses are applied when the phase change due to the static magnetic field inhomogeneity is offset by the inversion pulse, the phase shift due to the static magnetic field inhomogeneity is not generated. Thus, the influence of the phase shift due to the static magnetic field inhomogeneity in the $B_1$ distribution characteristic can be reduced. As a result, in correction of a high frequency magnetic field $B_1$, the correction can be performed without being influenced by the static magnetic field $B_0$.

Fifth Embodiment

It is desirable that the number of the sub pulses be large in order to improve accuracy of local excitation, however, in the case where the number of the sub pulses is large, when the inversion pulse is applied between the sub pulses, the application time of local excitation RF pulses becomes long, leading to burdens on a patient.

Then, in the fifth embodiment, it is assumed to form a sub pulse set for which the plurality of sub pulses are put together and apply the inversion pulse between the plurality of sub pulse sets.

An excitation pulse sequence of a magnetic resonance imaging apparatus relating to the fifth embodiment will be described with reference to FIG. 16.

The sub pulse set for which the number smaller than the total number of the plurality of sub pulses is turned to one set is assumed. In an example shown in FIG. 16, three sub pulses are turned to one set to form the sub pulse set, and each sub pulse set includes the pulses corresponding to every third trajectory on the k-space. Specifically, in the example in FIG. 16, the sub pulses corresponding to the "1"st, "4"th and "7"th trajectories are included in the first sub pulse set. The sub pulses corresponding to the "2"nd, "5"th and "8"th trajectories are included in the second sub pulse set. The sub pulses corresponding to the "3"rd, "6"th and "9"th trajectories are included in the third sub pulse set.

In addition, the negative gradient magnetic field is applied for the sub pulse positioned at the center of each sub set, and the positive gradient magnetic field is applied for the sub pulses on both sides of the sub pulse positioned at the center. Between the individual sub pulse sets, the inversion pulse is applied.

Figure 17:
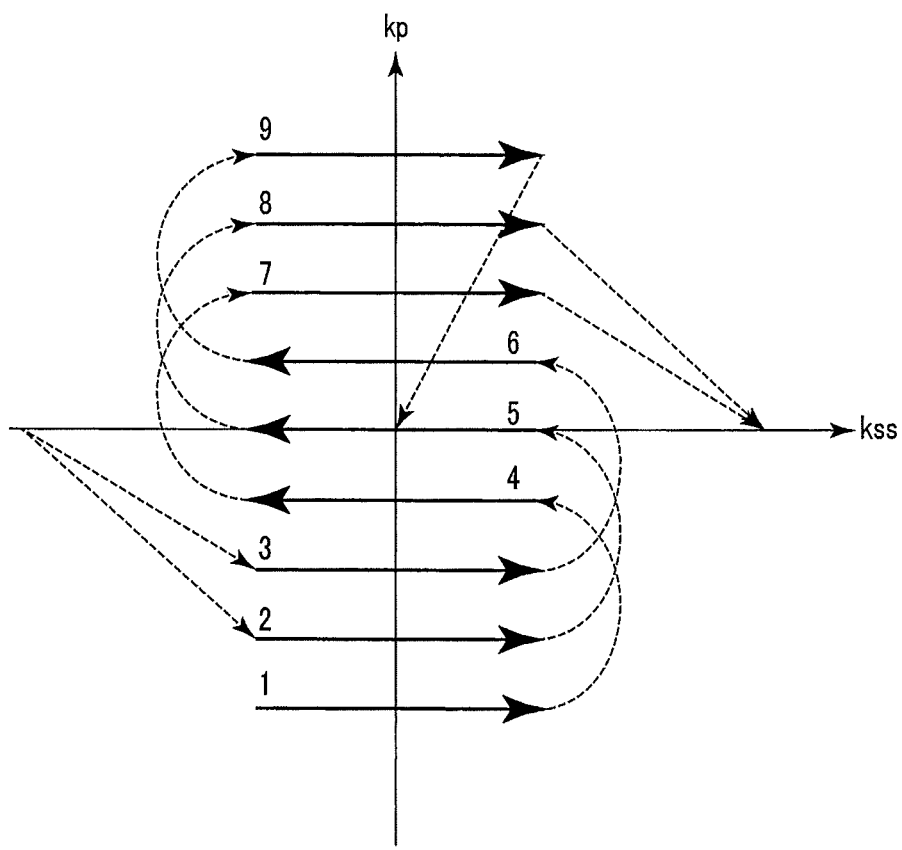
FIG. 17 is a diagram showing an example of a trajectory on the k-space by the excitation pulse sequence relating to the fifth embodiment.

Next, the trajectories on the k-space by the excitation pulse sequence relating to the fifth embodiment is shown in FIG. 17.

Figure 16:
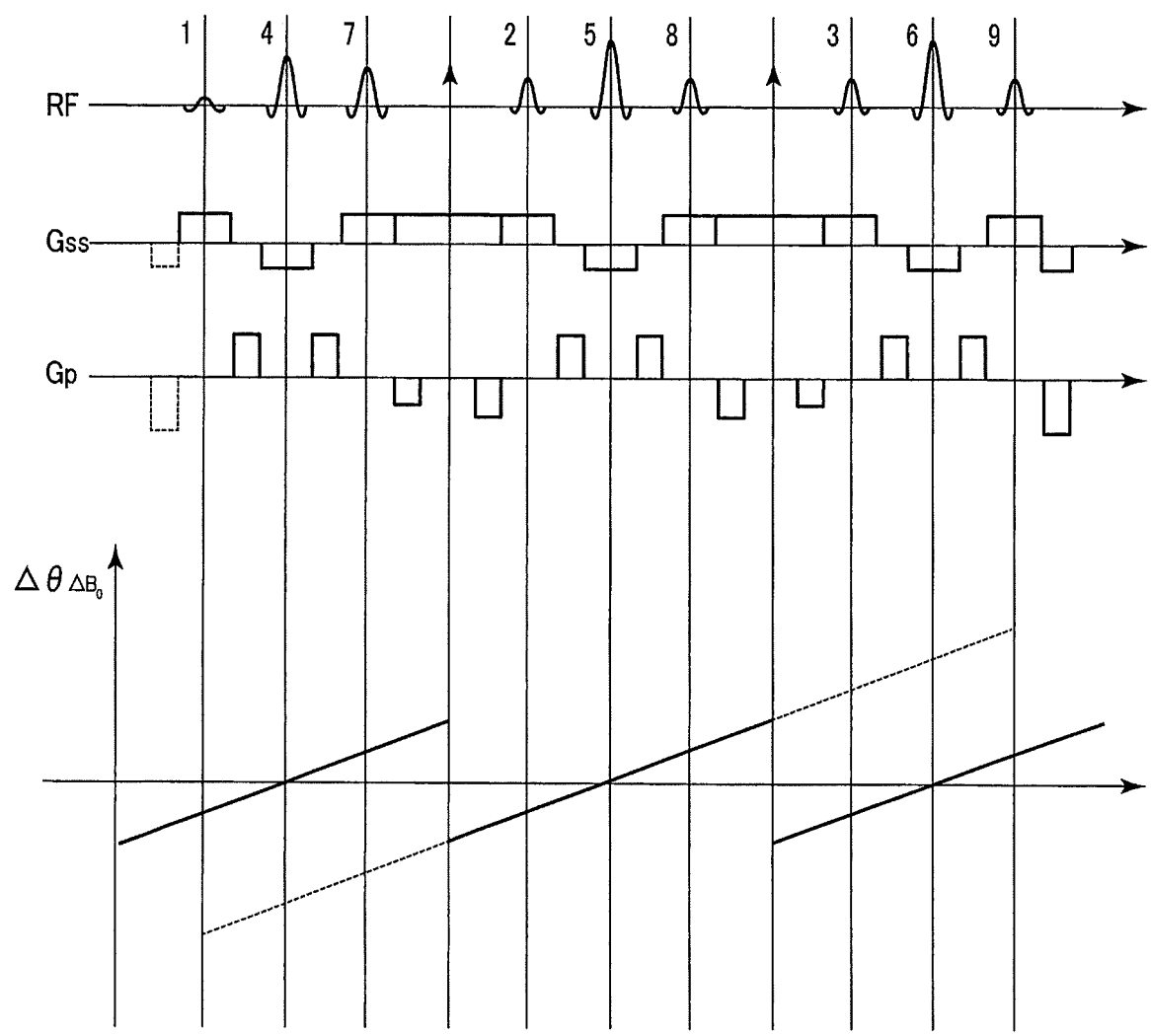
FIG. 16 is a diagram showing an excitation pulse sequence of a magnetic resonance imaging apparatus relating to a fifth embodiment.

The numbers of the trajectories indicated in FIG. 17 correspond to the numbers of the sub pulses indicated in FIG. 16. Movement is made from the first trajectory to the fourth trajectory skipping two, and the movement is made to the seventh trajectory skipping two further. Thereafter, the rewinder gradient magnetic field is applied, the shift amount in the phase encoding direction becomes zero, and the inversion pulse is applied.

Thereafter, similarly, the movement is made to the second trajectory, and the movement is made on the k-space and excitation is performed by the gradient magnetic field applied for the other sub pulses as well.

Figure 18:
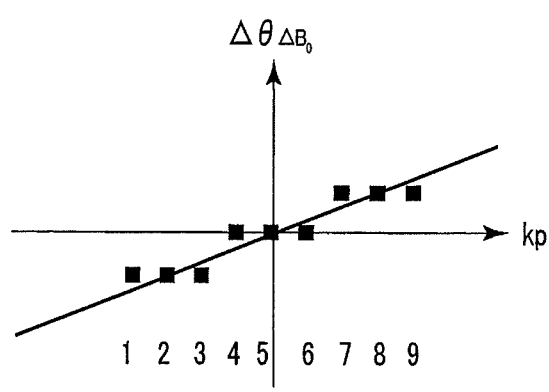
FIG. 18 is a diagram showing a relation between a phase difference of the magnetization and the trajectory on the k-space in the case of excitation according to the excitation pulse sequence in FIG. 16.

Then, a relationship between the phase difference of the magnetization and the trajectory on the k-space in the case of performing the excitation according to the excitation pulse sequence in FIG. 16 is shown in FIG. 18.

The vertical axis indicates the phase error of the static magnetic field, and the horizontal axis indicates the number of the trajectory in the phase encoding direction on the k-space, and corresponds to the number of the trajectory indicated in FIG. 17.

Specifically, the phase errors of the first to third pulses become the same value, the phase errors of the fourth to sixth pulses become the same value, and the phase errors of the seventh to ninth pulses become the same value.

In this way, since the inversion pulse is applied for every three sub pulses, the phase shift due to the static magnetic field inhomogeneity becomes stepwise at every three sub pulses on the k-space. Thus, since the phase shift becomes non-continuous, a ringing artifact can be generated in a phase direction in image reconfiguration processing of the MR images.

Figure 19:
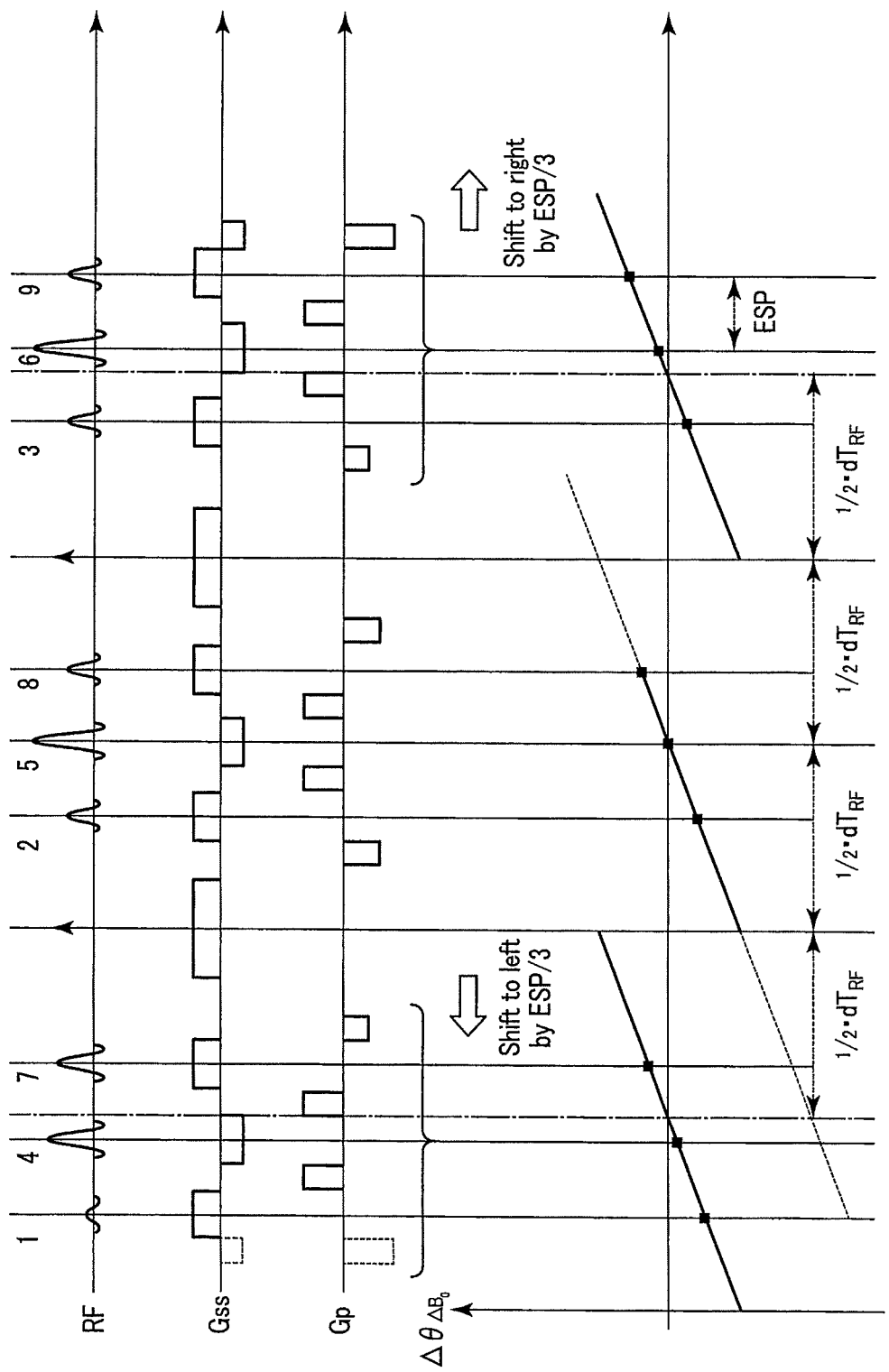
FIG. 19 is a diagram showing an excitation pulse sequence of the magnetic resonance imaging apparatus in the case of taking echo time shift into consideration.

Here, in order to dissolve the stepwise phase errors, an excitation pulse sequence taking echo time shift into consideration is shown in FIG. 19.

As shown in FIG. 19, with the second sub pulse set (the second, fifth and eighth sub pulses) positioned at the center as the reference, for the first sub pulse set (the first, fourth and seventh sub pulses), the application of the sub pulse set is quickened for the time corresponding to an interval of one third of the pulse interval (ESP: echo spacing) within the sub pulse set. On the other hand, for the third sub pulse set (the third, sixth and ninth sub pulses), the application of the sub pulse set is delayed for the time corresponding to an interval of one third of the ESP.

Figure 20:
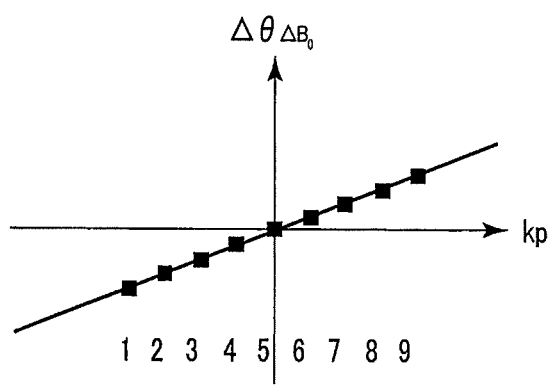
FIG. 20 is a diagram showing a relation between a phase error of the magnetization and the trajectory on the k-space in the case of the excitation according to the excitation pulse sequence in FIG. 19.

A relation between the phase error of the magnetization and the trajectory on the k-space in the case of performing the excitation according to the excitation pulse sequence in FIG. 19 is shown in FIG. 20.

The vertical axis indicates the phase error of the static magnetic field, and the horizontal axis indicates the number of the trajectory in the phase encoding direction on the k-space, and corresponds to the number of the trajectory indicated in FIG. 17.

As shown in FIG. 20, the phase errors are proportional according to an ascending order of the numbers of the individual trajectories, and it is recognized that discrete phase errors are dissolved. Thus, the excitation pulse sequence taking the echo time shift into consideration is achieved.

According to the fifth embodiment shown above, in the case of the local excitation pulse sequence including the plurality of sub pulse sets, the control of shifting the application timing for a period corresponding to the interval of one out of the number of the sub pulse sets of the sub pulse interval is executed. Thus, while shortening the application time of the RF pulses, the excitation pulse sequence taking the echo time shift into consideration can be achieved, and the generation of the artifact due to the influence of the discrete phase errors can be suppressed.

According to at least one of the embodiments described above, the image quality of the magnetic resonance images can be improved.

In addition, the individual functions relating to the embodiments can be achieved also by installing the programs which execute the processing to a computer of a work station or the like and developing them on the memory. At the time, the programs capable of making the computer execute the method can be stored in a storage medium such as a magnetic disk (such as a hard disk), an optical disk (such as a CD-ROM, a DVD, or a Blu-ray® disk) or a semiconductor memory or the like, and distributed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising processing circuitry configured to:
    set an excitation pulse sequence that applies an excitation pulse including an inversion pulse between at least one set of sub pulses of a local excitation radio frequency pulse formed of a plurality of sub pulses, and applies a spoiler gradient magnetic field that disperses transverse magnetization while applying the inversion pulse, the inversion pulse inverting positive and negative of longitudinal magnetization;
    control execution of the excitation pulse sequence by applying the excitation pulse and the spoiler gradient magnetic field according to the excitation pulse sequence;
    collect a magnetic resonance signal based on a data collecting sequence after execution of the excitation pulse sequence; and
    generate a magnetic resonance image using the magnetic resonance signal.

2. The apparatus according to claim 1, wherein the processing circuitry sets application timing of the inversion pulse such that a phase difference becomes equal to or smaller than a threshold at timing at which the plurality of sub pulses are respectively applied.

3. The apparatus according to claim 1, wherein the processing circuitry sets application timing of gradient magnetic field such that a negative gradient magnetic field is applied at timing at which the plurality of sub pulses are respectively applied and a positive spoiler gradient magnetic field is applied at the timing at which the inversion pulse is applied.

4. The apparatus according to claim 1, wherein the processing circuitry sets application timing of a gradient magnetic field such that the gradient magnetic field is continuously applied during an application period of the excitation pulse.

5. The apparatus according to claim 1, wherein the plurality of sub pulses are two-dimensional local excitation pulses that selectively excite a position at a slice.

6. The apparatus according to claim 1, wherein the plurality of sub pulses are excitation pulses used in a Spoke method.

7. The apparatus according to claim 1, wherein the inversion pulse is applied between the each pulse of the plurality of sub pulses.

8. The apparatus according to claim 1, wherein the inversion pulse is applied between pulse sets for which a number smaller than a total number of the plurality of sub pulses is one set.

9. A magnetic resonance imaging method comprising:
    setting an excitation pulse sequence that applies an excitation pulse including an inversion pulse between at least one set of sub pulses of a local excitation radio frequency pulse formed of a plurality of sub pulses, and applies a spoiler gradient magnetic field that disperses transverse magnetization while applying the inversion pulse, the inversion pulse inverting positive and negative of longitudinal magnetization;
    controlling execution of the excitation pulse sequence by applying the excitation pulse and the spoiler gradient magnetic field according to the excitation pulse sequence;
    collecting a magnetic resonance signal based on a data collecting sequence after execution of the excitation pulse sequence; and
    generating a magnetic resonance image using the magnetic resonance signal.

10. The method according to claim 9, wherein the setting sets application timing of the inversion pulse such that a phase difference becomes equal to or smaller than a threshold at timing at which the plurality of sub pulses are respectively applied.

11. The method according to claim 9, wherein the setting sets application timing of gradient magnetic field such that a negative gradient magnetic field is applied at timing at which the plurality of sub pulses are respectively applied and a positive spoiler gradient magnetic field is applied at the timing at which the inversion pulse is applied.

12. The method according to claim 9, wherein the setting sets application timing of a gradient magnetic field such that the gradient magnetic field is continuously applied during an application period of the excitation pulse.

13. The method according to claim 9, wherein
the plurality of sub pulses are two-dimensional local excitation pulses that selectively excite a position at a slice.

14. The method according to claim 9, wherein
the plurality of sub pulses are excitation pulses used in a Spoke method.

15. The method according to claim 9, wherein
the inversion pulse is applied between the each pulse of the plurality of sub pulses.

16. The method according to claim 9, wherein
the inversion pulse is applied between pulse sets for which a number smaller than a total number of the plurality of sub pulses is one set.

\* \* \* \* \*